(12) United States Patent
Jeannot et al.

(10) Patent No.: US 7,732,348 B2
(45) Date of Patent: Jun. 8, 2010

(54) METHOD OF PRODUCING A POROUS DIELECTRIC ELEMENT AND CORRESPONDING DIELECTRIC ELEMENT

(75) Inventors: Simon Jeannot, Grenoble (FR); Laurent Favennec, La Tronche (FR)

(73) Assignee: STMicroelectronics S.A., Montrouge (FR)

( * ) Notice: Subject to any disclaimer, the term of this patent is extended or adjusted under 35 U.S.C. 154(b) by 112 days.

(21) Appl. No.: 11/949,559

(22) Filed: Dec. 3, 2007

(65) Prior Publication Data

US 2008/0142929 A1    Jun. 19, 2008

(30) Foreign Application Priority Data

Dec. 15, 2006    (FR) .................................. 06 55558

(51) Int. Cl.
*H01L 21/31* (2006.01)
(52) U.S. Cl. ...................... 438/780; 438/623
(58) Field of Classification Search ................ 438/623, 438/780
See application file for complete search history.

(56) References Cited

U.S. PATENT DOCUMENTS

| 5,864,172 | A | 1/1999 | Kapoor et al. |
| 6,593,251 | B2 * | 7/2003 | Baklanov et al. ............ 438/778 |
| 6,774,057 | B1 | 8/2004 | Lu et al. |
| 2003/0146451 | A1 | 8/2003 | Huang et al. |
| 2004/0099952 | A1 | 5/2004 | Goodner et al. |

FOREIGN PATENT DOCUMENTS

| EP | 0 333 132 A2 | 9/1989 |
| EP | 1 260 991 | 11/2002 |
| EP | 1 420 439 | 5/2004 |
| JP | 11 021369 | 1/1999 |
| JP | 2004 292537 A | 10/2004 |

OTHER PUBLICATIONS

Preliminary French Search Report, FR 07 59356, dated Mar. 5, 2008.
Favennec, et al., "Porous extreme low kappa (ELkappa) dielectrics using a PECVD porogen approach;" Materials Science in Semiconductor Processing, Elsevier Science Publishers, B.V., Barking, UK, vol. 7, No. 4-6, 2004, pp. 277-282, XP004639152; ISSN: 1369-8001.
Preliminary French Search Report, FR 06 55558, dated Sep. 26, 2007.

\* cited by examiner

*Primary Examiner*—Zandra Smith
*Assistant Examiner*—Christy L Novacek
(74) *Attorney, Agent, or Firm*—Gardere Wynne Sewell LLP

(57) ABSTRACT

A porous dielectric element is produced by forming a first dielectric and a second dielectric. The second dielectric is dispersed in the first dielectric. The second dielectric is then removed from the second dielectric by using a chemical dissolution. The removal of the second dielectric from the first dielectric leaves pores in the first dielectric. The pores, which are filled with air, improves the overall dielectric constant of the resulting dielectric element.

13 Claims, 2 Drawing Sheets

METHOD OF PRODUCING A POROUS DIELECTRIC ELEMENT AND CORRESPONDING DIELECTRIC ELEMENT

PRIORITY CLAIM

The present application is a translation of and claims priority from French Application for Patent No. 06 55558 of the same title filed Dec. 15, 2006, the disclosure of which is hereby incorporated by reference.

BACKGROUND OF THE INVENTION

1. Technical Field of the Invention

The present invention relates to dielectric elements, especially but not exclusively to porous dielectric elements having a low dielectric constant, which are intended, for example, to be incorporated into integrated circuits.

2. Description of Related Art

To reduce information propagation times in the interconnects (metal lines, vias, etc.) of integrated circuits, it is beneficial to use materials having a low dielectric constant (or relative permittivity), typically of less than 4.0, in order to isolate these metal interconnects. In addition, a material having a low dielectric constant promotes decoupling between the various lines.

One way of decreasing the dielectric constant of a dielectric is to produce it in porous form. This is because, the presence in the pores of gas, the dielectric constant of which, equal to 1, is the lowest possible, makes it possible to reduce the overall dielectric constant of the porous material.

A known method of producing a porous material consists in producing a hybrid material comprising, on the one hand, an $Si_wO_xC_yH_z$ matrix and, on the other hand, nanoscale organic inclusions and then in degrading, by a heat treatment alone or a heat treatment enhanced by ultraviolet radiation or by an electron beam, the organic inclusions so as to obtain the final porous material.

SUMMARY OF THE INVENTION

According to one mode of implementation, a method is presented for producing a porous dielectric that requires no heat treatment step.

According to a first aspect, what is proposed is a method of producing a porous dielectric element, comprising: a) forming at least a first dielectric and at least a second dielectric dispersed in the first dielectric; and b) removing the second dielectric, this removal performed by a chemical dissolution.

Since the degradation of the second dielectric comprises a chemical dissolution, the method dispenses with a heat treatment step.

The porous dielectric has, for example, a dielectric constant of 3.0 or less.

According to one mode of implementation, the first dielectric is permeable to hydrofluoric acid and to the products of the dissolution of the second dielectric by hydrofluoric acid, and the removal of the second dielectric comprises dissolving the second dielectric by a fluid containing hydrofluoric acid.

The fluid containing hydrofluoric acid may, for example, be a hydrofluoric acid solution with a concentration of between 0.01% and 100%.

Hydrofluoric acid is already used in microelectronics for other types of application, such as etching, and the manner of handling it is fully controlled. It is therefore easy to use it to produce a porous material.

For example, the fluid containing hydrofluoric acid comprises at least one of the compounds chosen from the group formed by: liquid hydrofluoric acid, gaseous hydrofluoric acid and hydrofluoric acid diluted in supercritical carbon dioxide.

Advantageously, the second dielectric contains silicon-oxygen bonds. This is because, since hydrofluoric acid attacks mainly silicon-oxygen bonds, by producing the second dielectric with such bonds it is easy to degrade it and to obtain a final porous element.

The second dielectric comprises, for example, at least one of the materials chosen from the group formed by $SiO_2$, $Si_wO_xC_yH_z$ and siloxanes.

Advantageously, the first dielectric is chosen so as to have a low dielectric constant, for example less than 3.5. In addition, the first dielectric is advantageously resistant and permeable both to hydrofluoric acid and to the residues of dissolution of the second dielectric by hydrofluoric acid.

According to one mode of implementation, the first dielectric does not contain any silicon-oxygen bonds so as not to be degraded during the hydrofluoric acid treatment. Thus, it is possible to choose a first dielectric containing no oxygen atoms but containing, for example, only silicon, carbon and hydrogen atoms, or else a first dielectric containing no silicon atoms.

Thus, the first dielectric may comprise a dielectric chosen from the group formed by $Si_xC_yH_z$ and a hydrocarbon dielectric resin not containing any silicon atoms, such as that known by those skilled in the art by the name SiLK.

The volume of the second dielectric during the first step of the method makes it possible to define the volume of gas in the porous dielectric element. Since the gas has the lowest dielectric constant, i.e. 1, the larger its volume in the porous dielectric element the lower the dielectric constant of said porous dielectric element.

The proportion by volume of the second dielectric in the formation of the first dielectric and of the second dielectric is advantageously between 10% and 40%.

According to another aspect, what is proposed is a porous dielectric element comprising a dielectric containing no silicon-oxygen bonds but having gas pockets dispersed in the dielectric.

Advantageously, the porosity is greater than 10%, for example between 10% and 40%.

The dielectric, for example, contains no oxygen atoms and/or contains no silicon atoms.

According to another aspect, what is proposed is an integrated circuit comprising a porous dielectric element as defined above.

BRIEF DESCRIPTION OF THE DRAWINGS

Other advantages and features of the invention will become apparent on examining the detailed description of entirely non-limiting modes of implementation and embodiments, and from examining the appended drawings in which.

DETAILED DESCRIPTION OF THE DRAWINGS

Figure 1:
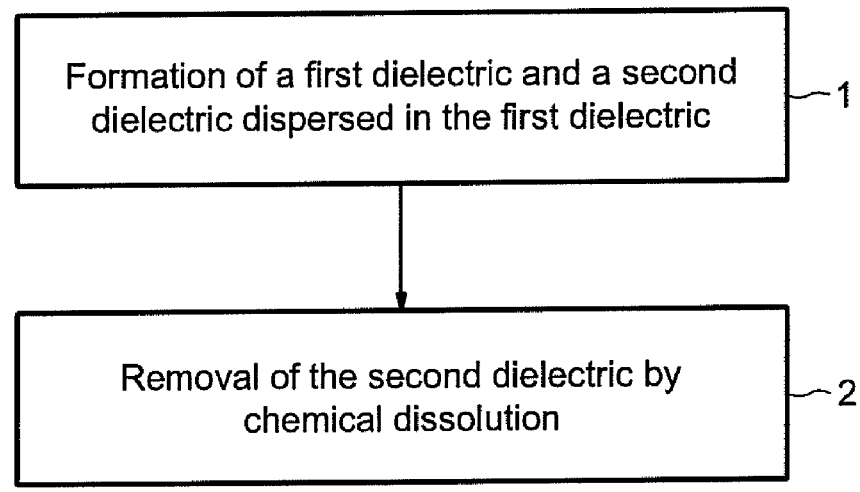
FIG. 1 illustrates very schematically the main steps of one mode of implementing the method.

FIG. 1 shows schematically the main steps in implementing a method for producing a porous dielectric element. More precisely, the method of FIG. 1 comprises a step 1 of forming a first dielectric and a second dielectric dispersed in the first dielectric, and a step 2 of removing the second dielectric by chemical dissolution.

Step 1 of forming the first and second dielectrics may be carried out for example by PECVD (plasma-enhanced chemical vapor deposition) or by spin-on deposition on a support, for example, a silicon substrate. Dissolution removal step 2 may, for example, be carried out using a hydrofluoric acid solution, widely used in the electronic industry, there being no particular problem in handling said solution.

Although it is advantageous to use hydrofluoric acid because of its conventional handling in the microelectronics field, it is also possible to use other fluids, such as a solution containing phosphoric acid $H_3PO_4$ with a concentration of between 0.01% and 100%, or else a solution containing hydrofluoric acid buffered to a concentration of between 0.01% and 100%, for example, a solution containing ammonium fluoride $NH_4F$ and known to those skilled in the art by the name BOE.

Figure 2:
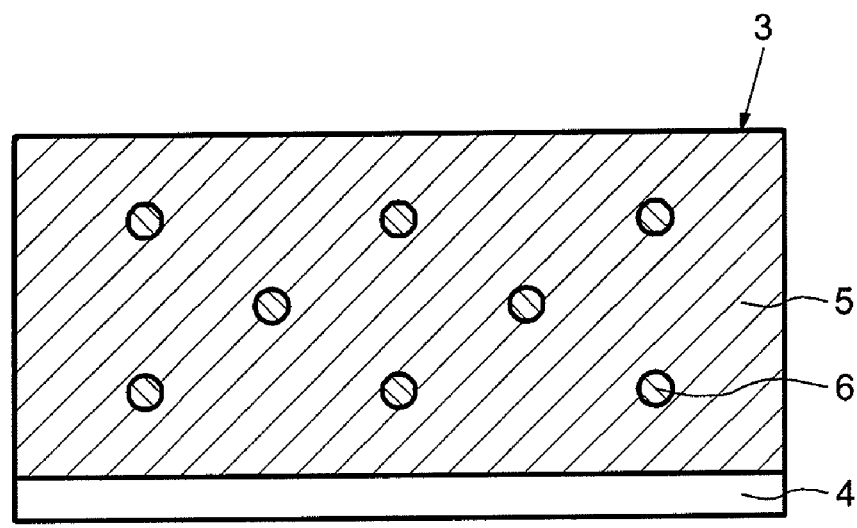
FIGS. 2 and 3 show an example of a dielectric element before dissolution and after dissolution by hydrofluoric acid, respectively.

FIG. 2 shows a dielectric element 3 formed on a silicon substrate 4 before removal of the second dielectric. The dielectric element 3 thus comprises, on the one hand, a first dielectric 5, preferably having a low dielectric constant and, on the other hand, inclusions of a second dielectric 6. The first dielectric 5 is, for example, amorphous $Si_xC_yH_z$—this is both resistant and permeable to hydrofluoric acid, and has a dielectric constant of less than 3.5. With regards the second dielectric 6, $Si_wO_xC_yH_z$, which contains silicon-oxygen bonds, may be chosen.

According to one mode of implementation, the dielectric element 3 is formed by PECVD deposition. For example, a rig of the plane capacitive type, such as a DxZ chamber of an AMAT Centura 5200 machine, may therefore be used. The parameters used will then be the following: inter-electrode space between 200 mm and 600 mm; radiofrequency excitation at 13.56 MHz; power between 100 and 900 watts; temperature between 100° C. and 300° C.; and pressure between 2 and 10 torr.

The precursors used are of two types: the first precursor is an organosilicon precursor of $Si_xC_yH_z$ type containing at least one phenyl group and no oxygen atoms, for example dimethylphenylsilane, and makes it possible to form the first dielectric 5 having a low dielectric constant. The second precursor is an organosilicon precursor of $Si_wO_xC_yH_z$ type for forming the second dielectric 6, and contains at least one silicon-oxygen bond, for example tetraethylorthosilicate. Using flow rates of between 50 and 1000 cm$^3$/minute, it is then possible to obtain a dielectric element 3 consisting of a major phase of a first dielectric 5 containing no silicon-oxygen bonds and a minor, or sacrificial, phase of a second dielectric 6 containing silicon-oxygen bonds. The minor phase of the second dielectric 6 is uniformly dispersed in the major phase of the first dielectric 5. The proportion of the minor phase relative to the combination of the minor and major phases may be between 10% and 40%.

The dielectric element 3 thus obtained then has a refractive index, at 632 nm, of between 1.4 and 1.9 and is thermally stable between 300 and 400° C. It may be characterized by various techniques, for example: ellipsometry, FTIR (Fourier transform infrared) spectroscopy or XPS (X-ray photospectroscopy), so as to determine the proportions of the first and second dielectrics.

According to another mode of implementation, the dielectric element 3 may be produced by spin-on deposition, on a silicon substrate 4, of a first dielectric 5 such as SiLK, mixed with molecules containing silicon-oxygen bonds, for example, siloxane molecules of the decamethylcyclopentasiloxane type, forming the second dielectric 6. The SiLK does not contain any silicon atoms, but mainly carbon and hydrogen atoms, and therefore is not dissolved by hydrofluoric acid.

Figure 3:
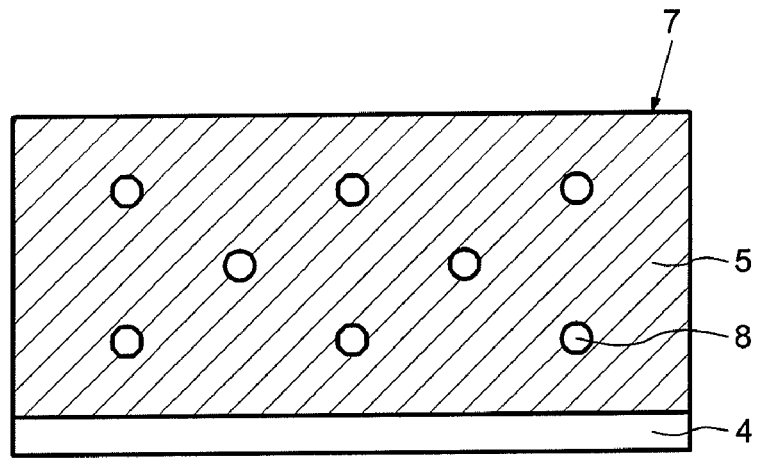

FIG. 3 shows the porous dielectric element 7 after the second dielectric 6 of the dielectric element 3 shown in FIG. 2 has been dissolved by hydrofluoric acid. The porous dielectric element 7 consists of the first dielectric 5 and inclusions, or pockets, of gas 8—in the present case air pockets.

The hydrofluoric acid treatment is for example carried out by dipping in an aqueous hydrofluoric acid solution with a dilution of 5%. The treatment thus makes it possible, for example, in the first mode of implementation, to dissolve the minor phase, namely the $Si_wO_xC_yH_z$ second dielectric 6, dispersed in the major phase, namely the $Si_xC_yH_z$ first dielectric 5, by attacking the silicon-oxygen bonds. The porous dielectric element 7 then has a porosity that may be between 10% and 40% and a dielectric constant that lies between 3.0 and 2.2 depending on the porosity.

Thus, according to the method described above, the porous dielectric element 7 is produced by attacking the silicon-oxygen bonds of the dielectric element 3, whereas the previously known methods used, on the contrary, silicon-oxygen bonds as resistant bonds of the major phase. The porous dielectric element 7 described above is therefore distinguished from the known porous low-dielectric-constant materials by its composition. Thus, the prior art commonly uses materials of the $Si_wO_xC_yH_z$ type to form the matrix, or major phase, of the porous dielectric, whereas in the present case the $Si_wO_xC_yH_z$ material may be used as sacrificial material, or minor phase, intended to be removed in a second step.

The method as described above therefore makes it possible to obtain a porous dielectric element comprising interstitial voids containing gas. Moreover, the material forming the matrix, or major phase, of the dielectric element contains no silicon-oxygen bonds and preferably has a low dielectric constant.

Figure 4:
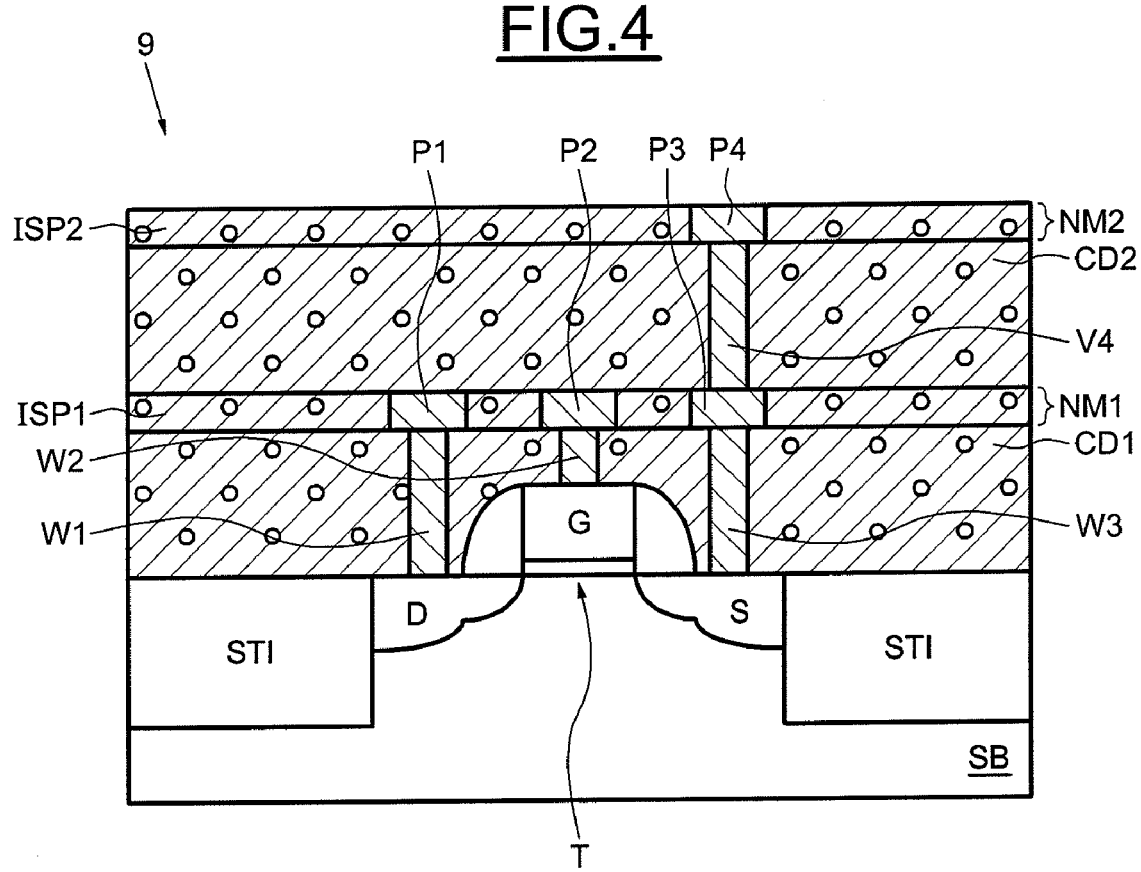
FIG. 4 shows an example of an integrated circuit comprising a porous dielectric element.

FIG. 4 shows an example of an integrated circuit 9. The integrated circuit 9 comprises, on the one hand, a substrate SB in which two isolation zones STI and a transistor T have been produced and, on the other hand, an interconnection part comprising, for example, two metallization levels NM1, NM2 and two inter-level dielectric layers CD1, CD2. The transistor T conventionally comprises a drain zone D, a source zone S and a gate zone G, and the first dielectric layer CD1 covering the transistor T is penetrated by contacts W1, W2, W3. The contacts W1, W2, W3 electrically connect the various elements of the transistor T to the metal tracks P1, P2, P3 of the metallization level NM1 and are isolated from one another by the material of the dielectric layer CD1, for example a porous dielectric as described in FIG. 3.

The inter-track insulation ISP1 at the level NM1 may also be produced with a porous dielectric as described above.

The second dielectric layer CD2 lies on top of the metallization level NM1 and is itself covered by the second metallization level NM2. The metallization level NM2 includes a metal track P4, for example connected to the metal track P3 by a via V4 passing through the dielectric layer CD2. The material forming the dielectric layer CD2 and/or the inter-track insulation ISP2 of the second metallization level NM2 may, here again, be chosen from low-dielectric-constant materials and may, in the present case, be formed by a porous dielectric as described above.

When several dielectric layers and/or inter-track insulations of the interconnection part are produced from porous dielectrics, as described above, step 2, of removal by chemical dissolution, may be carried out:
- either after step 1 of forming each dielectric layer or inter-track insulation;
- or after several steps 1 of forming dielectric layers and/or inter-track insulations, step 2, of removal by chemical dissolution, then being common to all of these dielectric layers and/or inter-track insulations.

The porous low-dielectric-constant material forming the inter-level and/or inter-track insulation therefore makes it possible to reduce, on the one hand, the information propagation time in the tracks and, on the other hand, the inter-track crosstalk.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A method of producing a porous dielectric element, comprising:
    forming of at least a first dielectric and at least a second dielectric which is dispersed in the first dielectric, wherein the first dielectric is a dielectric formed by $Si_xC_yH_z$; and
    removing of the second dielectric by a chemical dissolution.

2. The method according to claim 1, wherein the porous dielectric element has a dielectric constant of 3.0 or less.

3. The method according to claim 1, wherein the first dielectric is permeable to hydrofluoric acid and to the products of the dissolution of the second dielectric by hydrofluoric acid, and wherein removing the second dielectric comprises dissolving the second dielectric by a fluid containing hydrofluoric acid.

4. The method according to claim 3, wherein the fluid containing hydrofluoric acid comprises at least one of the compounds chosen from the group formed by: liquid hydrofluoric acid, gaseous hydrofluoric acid and hydrofluoric acid diluted in supercritical carbon dioxide.

5. The method according to claim 3, wherein the second dielectric contains silicon-oxygen bonds.

6. The method according to claim 5, wherein the second dielectric comprises at least one of the materials chosen from the group formed by: $SiO_2$, $Si_wO_xC_yH_z$ and siloxanes.

7. The method according to claim 1, wherein the proportion by volume of the second dielectric in the formation of the first dielectric and of the second dielectric is between 10% and 40%.

8. The method according to claim 1, wherein forming comprises performing plasma-enhanced chemical vapor deposition using a first-type organosilicon precursor for forming the first dielectric and using a second-type organosilicon precursor for forming the second dielectric, wherein the second dielectric is uniformly dispersed within the first dielectric.

9. The method according to claim 1, wherein forming comprises performing spin-on deposition of the first dielectric mixed with molecules which comprise the second dielectric.

10. The method according to claim 1, wherein forming comprises using a material for the second dielectric, which is dispersed within the first dielectric, that includes silicon-oxygen bonds and wherein removing comprises attacking the silicon-oxygen bonds of the second dielectric material by chemical dissolution.

11. A method of producing a porous dielectric element, comprising:
    forming of at least a first dielectric and at least a second dielectric which is dispersed in the first dielectric; and
    removing of the second dielectric by a chemical dissolution;
    wherein forming comprises performing plasma-enhanced chemical vapor deposition using a first-type organosilicon precursor for forming the first dielectric and using a second-type organosilicon precursor for forming the second dielectric, wherein the second dielectric is uniformly dispersed within the first dielectric; and
    wherein the first-type organosilicon precursor is of $Si_xC_yH_z$ type and the second-type organosilicon precursor is of $Si_wO_xC_yH_z$ type.

12. The method according to claim 11, wherein the $Si_xC_yH_z$ type is dimethylphenylsilane and the $Si_wO_xC_yH_z$ type is tetraethylorthosilicate.

13. A method of producing a porous dielectric element, comprising:
    forming of at least a first dielectric and at least a second dielectric which is dispersed in the first dielectric; and
    removing of the second dielectric by a chemical dissolution;
    wherein forming comprises performing spin-on deposition of the first dielectric mixed with molecules which comprise the second dielectric;
    wherein the first dielectric is SiLK material and the second dielectric comprises siloxane molecules; and
    wherein the SiLK material does not contain any silicon atoms and the siloxane is of the decamethylcyclopentasiloxane type.

* * * * *